United States Patent

Gunn et al.

[15] 3,641,441

[45] Feb. 8, 1972

[54] FREQUENCY CONVERSION MODULE INCLUDING EMITTER FOLLOWER MIXER

[72] Inventors: David L. Gunn, Lombard; George M. Hanus, Norridge, both of Ill.

[73] Assignee: Motorola, Inc., Franklin Park, Ill.

[22] Filed: Nov. 13, 1969

[21] Appl. No.: 876,303

[52] U.S. Cl. ..............................325/430, 325/442, 325/451

[51] Int. Cl. ..............................H04b 1/26

[58] Field of Search ..................325/430, 438, 439, 442, 451; 330/32; 332/66

[56] References Cited

UNITED STATES PATENTS 2,582,725 1/1952 Strutt et al. ..........................325/430

3,107,331 10/1963 Barditch et al. ......................325/442

3,471,793 10/1969 Miwa et al. ...........................330/32

*Primary Examiner*—Richard Murray
*Attorney*—Mueller and Aichele

[57] ABSTRACT

A frequency conversion circuit for a frequency-modulated receiver adapted to be manufactured in integrated circuit form. The circuit includes an oscillator of the Colpitts type, a mixer arranged in an emitter follower configuration, and input and output amplifiers. A feedback circuit coupled between the input amplifier and mixer allows operation of the circuit over a substantial voltage range. Arrangement of the mixer in an emitter follower configuration results in reduced levels of undesired frequencies. The gain of the input and output amplifiers may be varied allowing usage in different products.

18 Claims, 2 Drawing Figures

Inventors
DAVID L. GUNN
GEORGE M. HANUS
BY Mueller, Aichele & Rauner
ATTYS.

Inventors
DAVID L. GUNN
GEORGE HANUS
BY
Mueller, Aichele & Rauner
ATTYS.

FREQUENCY CONVERSION MODULE INCLUDING EMITTER FOLLOWER MIXER

BACKGROUND OF THE INVENTION

Frequency-modulated radio receivers normally include a first radiofrequency amplification stage, and one or more stages of intermediate frequency amplification. A frequency conversion stage is employed between the radiofrequency amplification stage and the intermediate frequency amplification stage, and such a stage may be used between two intermediate frequency amplification stages in order to convert the frequency in the first stage to the frequency of the second stage. The frequency conversion stage may consist of a transistor amplifier biased to operate as a mixer, and a local oscillator. It may also include amplification before and after the mixer circuit.

As radios are made smaller it becomes more desirable to package the radio circuitry, including the frequency conversion portion, in integrated circuit form. In order to adapt the frequency conversion circuit for use in an integrated circuit, the mixer circuitry, which normally contains a tuned circuit including inductors and capacitors in its output, must be substantially redesigned to eliminate these components. Maximum adaptability to integrated circuit form is provided when all stages of the circuit are capable of being direct current coupled. The design of an integrated circuit which contains an oscillator, amplifiers, and a mixer, is extremely difficult due to the instabilities inherent when these circuits are operated in close proximity.

Because of the high cost involved in designing and manufacturing an integrated circuit, it is desirable to design an integrated circuit capable of being used in a number of different radio products. Each radio product, however, because of its design, may have different amplification characteristics in the various stages of the radio. In addition, radios designed for use in a particular application are designed to operate from power sources available for that application. The amount of voltage supplied by the power source can vary substantially depending upon the particular application.

SUMMARY OF THE INVENTION

It is, therefore, an object of this invention to provide an improved frequency conversion circuit.

Another object of this invention is to provide an improved frequency conversion circuit which can be manufactured in integrated circuit form.

Yet another object of this invention is to provide an improved frequency conversion circuit wherein all of the stages are direct current coupled.

A further object of this invention is to provide a frequency conversion circuit which has variable gain for use in various radio products.

Still another object of this invention is to provide a frequency conversion circuit capable of operating over a substantial voltage range.

A still further object of this invention is to provide an improved frequency conversion circuit wherein the mixer does not require a tuned circuit in the output.

Another object of this invention is to provide a frequency conversion circuit wherein the proximity of the oscillator does not cause instability in the mixer and amplifiers.

Yet another object of this invention is to provide an improved frequency conversion circuit wherein the mixer is arranged in an emitter follower configuration.

In practicing this invention, a direct current coupled frequency conversion circuit is provided which may be constructed as an integrated circuit. The direct current coupled frequency conversion circuit includes an input amplifier, an oscillator of the Colpitts type, a mixer consisting of a transistor arranged in an emitter follower configuration, and an output amplifier. Signals coupled to the frequency conversion circuit are amplified in the input amplifier and heterodyned with signals from the oscillator in the mixer to produce a resultant signal. The resultant signal is then amplified by the output amplifier and coupled to the following stages of a radio receiver. In receivers having substantial gain in stages prior to the frequency conversion circuit, the input signal can be coupled directly to the mixer, bypassing the input amplifier. A direct current coupled feedback circuit, coupled between the output of the mixer and the input amplifier, allows operation of the circuit over a substantial range of supply voltages by varying the bias supplied to the mixer and input amplifier.

The use of an emitter follower configuration for a mixer allows a tuned circuit to be eliminated from the output of the mixer. Elimination of a tuned circuit which includes inductive and capacitive reactance facilitates the construction of the mixer as an integrated circuit.

Because of the small size of an integrated circuit there is a greater tendency for the various circuits to interact. In a mixer this becomes especially critical as very little or no input or oscillator signal is desired in the output signal. The use of an emitter follower configuration for a mixer further increases the isolation between the output signal and the input and oscillator signals. The use of emitter follower configuration for a mixer further allows the output amplifier to be designed without a feedback circuit containing reactance components normally required to prevent oscillation of the amplifiers. Elimination of these reactance components further facilitates construction of the circuit as an integrated circuit. In the integrated circuit, the oscillator portion is isolated from the remainder by an extra width diffusion barrier to prevent interaction with the other portions of the integrated circuit.

The value of reactance components at the input and output of the mixer, which are not incorporated into the integrated circuit, may be changed to vary the amplification of the frequency conversion circuit, allowing use of the circuit in various receiver configurations.

DESCRIPTION OF THE PREFERRED EMBODIMENT

Figure 1:
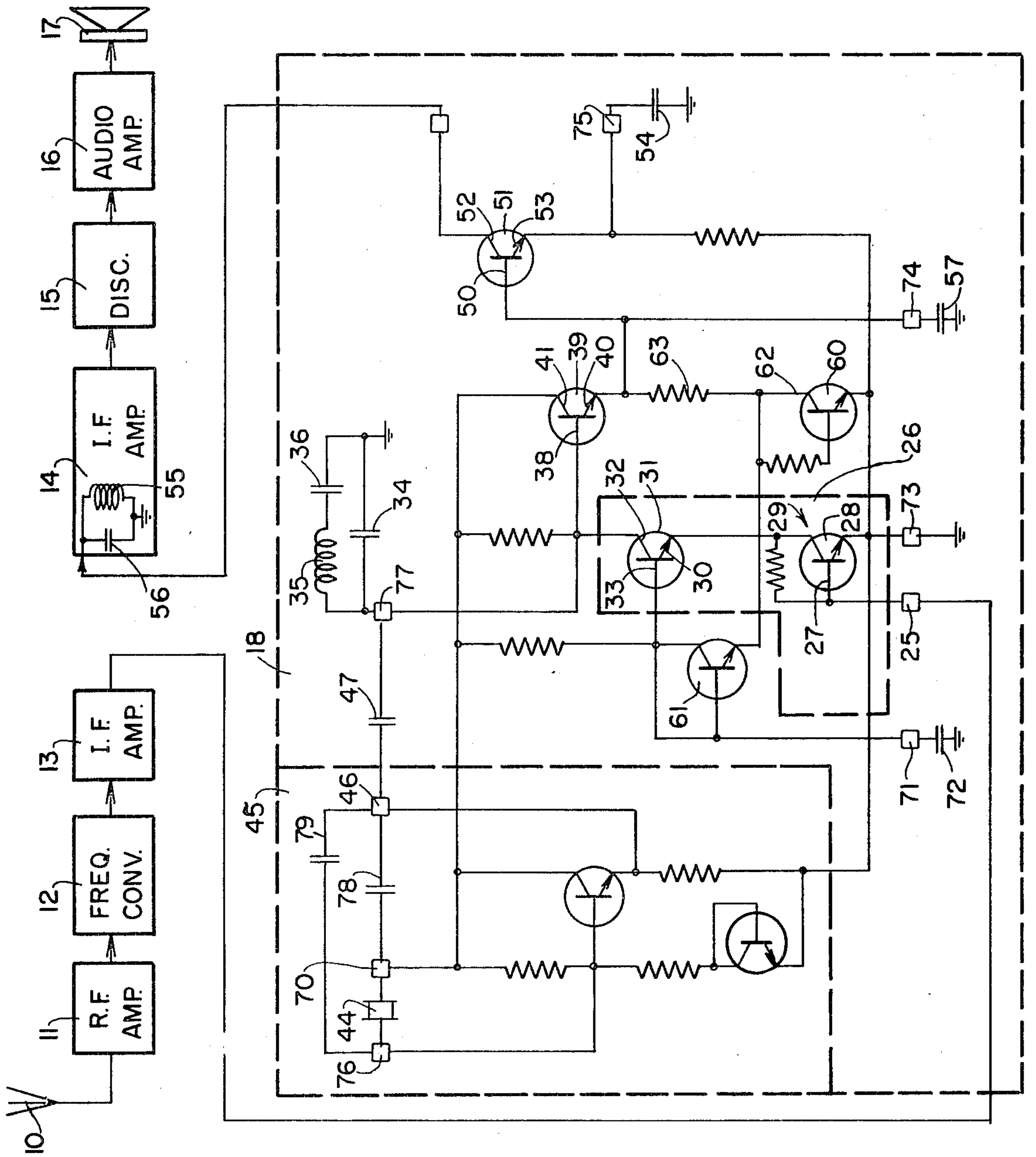
FIG. 1 is a partial schematic and partial block diagram of a receiver circuit incorporating the frequency conversion circuit of this invention.

FIG. 1 illustrates a radio receiver circuit wherein a radiofrequency signal is received at antenna 10, amplified in radiofrequency (RF) amplifier 11, and converted to an intermediate frequency in frequency converter 12. The intermediate frequency signal is amplified in intermediate frequency (IF) amplifier 13, and coupled to a second frequency converter module 18, further described in a subsequent portion of the application, where it is converted to a lower intermediate frequency signal. This second lower intermediate frequency signal is amplified in IF amplifier 14 and coupled to discriminator 15 where it is converted to audiofrequency signals. The audiofrequency signals are amplified in audio amplifier 16 and coupled to an audio processor such as a speaker 17, for reproduction as an audible signal.

Intermediate frequency signals are coupled to input 25 of frequency conversion module 18 from IF amplifier 13. In this particular embodiment the input signal is 11.7 mHz. The input signal is applied to base 27 of transistor 28 in amplifier 26. Transistor 28 is arranged in what is commonly termed a common emitter configuration. The IF signal is amplified in transistor 28 and coupled from collector 29 of transistor 28 to emitter 30 of transistor 31 in amplifier 26. Transistor 30 is arranged in what is commonly termed a common base configuration. The combination of a common emitter amplifier (transistor 28) and a common base amplifier (transistor 31) is commonly termed by those skilled in the art, a cascode amplifier. Cascode amplifier 26 does not require a reactive feedback network to stabilize the amplifier. Without a reactive feedback network, substantial isolation is provided between the input and output terminals of amplifier 26 facilitating its use in an integrated circuit. The amplified input signal is coupled from collector 32 of transistor 31 in amplifier 26 to base 38 of transistor 39.

In radios having substantial gain in IF amplifier 13 or RF amplifier 11, the use of cascode amplifier 26 in frequency conversion module 18 may not be necessary. In such cases the intermediate frequency signals are coupled to pad 77 of frequency conversion module 18. Pad 77 couples the signals directly to base 38 of transistor 39.

Oscillator 45 in frequency conversion module 18 is a crystal controlled transistor oscillator of the Colpitts type. In this particular embodiment, the signal generated is 11.245 MHz. The oscillator signal is coupled from output 46 through coupling capacitor 47 to base 38 of transistor 39. Transistor 39 is arranged in an emitter follower configuration. Signals from oscillator 45 and amplifier 26 are heterodyned at base 38 of transistor 39 to produce a resultant signal. The series combination of inductor 35 and capacitor 36 coupled to base 38 of transistor 39 is series resonant at the resultant signal frequency to increase the efficiency of the heterodyning action. Capacitor 34 in parallel with the series combination of inductor 35 and capacitor 36 forms a parallel tuned circuit antiresonant at the frequency of the input signal preventing the input signal from being coupled to other portions of frequency conversion module 18. The resultant signal, in this embodiment 455 kHz., is coupled from emitter 40 of transistor 39 to base 50 of transistor 51. Because mixer transistor 39 is arranged in an emitter follower configuration, the parallel inductor-capacitor tuned circuit normally required at the collector of a transistor mixer is not required. Capacitor 57 coupled to emitter 40 of transistor 39 acts as a short circuit at the input and oscillator frequencies, thereby preventing amplification of these signals by transistor 51. Additionally, capacitor 54 acts as a current source for transistor amplifier 51. At the frequency of the resultant signal, the impedance from base 50 of transistor 51 to ground is very low. Signals coupled to base 50 of transistor amplifier 51 are amplified and coupled from collector 52 of transistor 51 to a tuned circuit in IF amplifier 14 consisting of the parallel combination of inductor 55 and capacitor 56. When am amplifier is coupled to a tuned circuit, a negative feedback circuit, normally provided by a reactive component, is necessary to prevent the amplifier from oscillating. The low impedance from base 50 of transistor 51 to ground, provided by capacitor 57, prevents transistor amplifier 51 from oscillating without the need for a reactive feedback circuit.

In order to provide for use of this circuit in different types of radios operating from different voltage sources, a direct current coupled feedback circuit consisting of transistor 60 and diode-connected transistor 61 is provided. Transistor 60 is designed to match transistor 28 in cascode amplifier 26, and diode-connected transistor 61 is provided to compensate for the voltage drop between base 33 and emitter 30 of transistor 31 in cascode amplifier 26. Collector 62 of transistor 60 is connected to emitter 40 of transmitter 39 through resistor 63. As the voltage applied to module 18, at terminal 70 increases, the current through collector 41 and emitter 40 of transistor 39 increases, thereby increasing the DC potential at collector 62 of transistor 61. The increased potential at collector 62 is coupled through diode-connected transistor 61 increasing the bias voltage at the base 33 of transistor 31. The increased bias voltage at base 33 of transistor 31 causes the voltage at collector 32 of transistor 31 to decrease, thereby decreasing the bias at base 38 of transistor 39. With a decreased bias at base 38 of transistor 39, less current is allowed to pass through collector 41 and emitter 40 of transistor 39.

Figure 2:
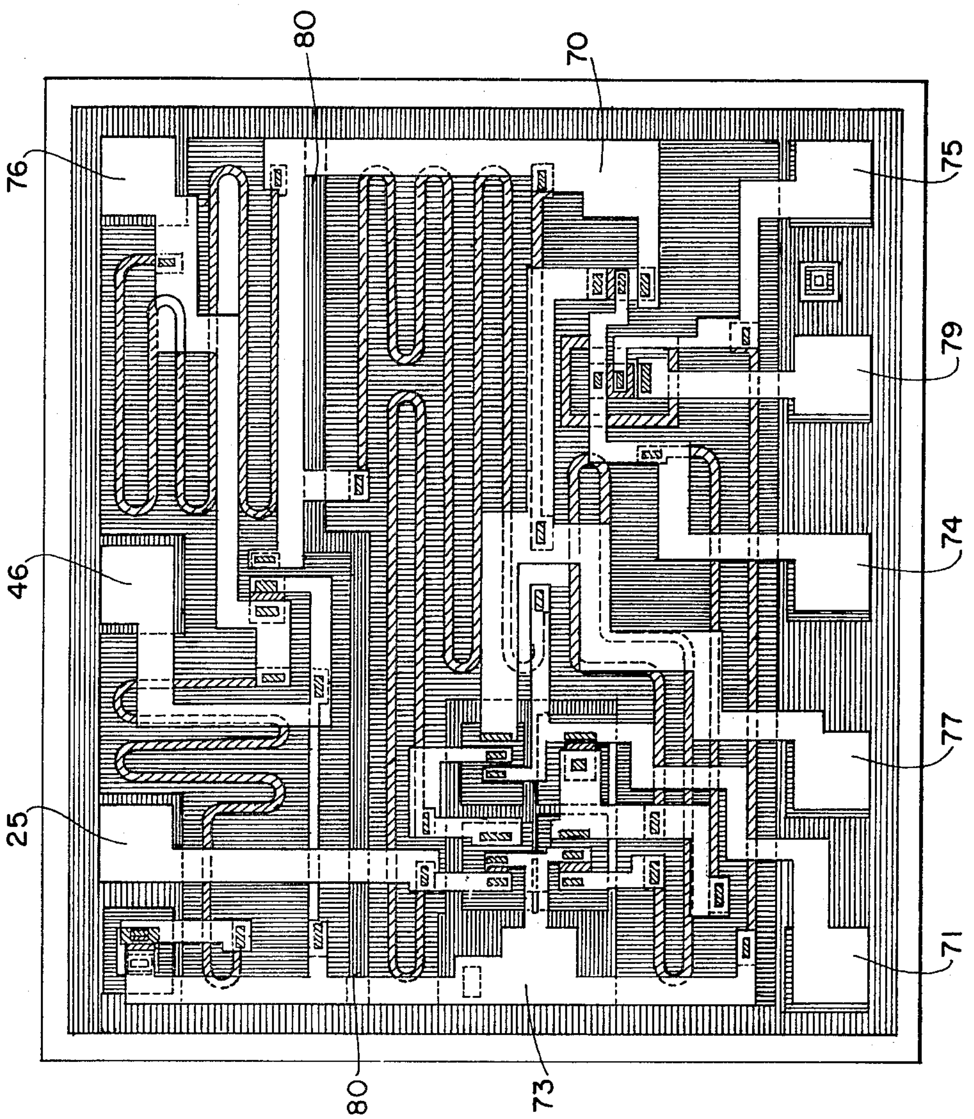
FIG. 2 is a drawing of an integrated circuit chip showing the structural layout of the circuit of FIG. 1 in an integrated form.

The circuit of this invention is especially adapted to be manufactured in integrated circuit form. FIG. 2 illustrates an integrated circuit ship incorporating the circuit shown in FIG. 1. The portions of the chip which correspond to the circuit elements of FIG. 1 have the same reference numbers. Ground potential is applied to pad 73. Bypass capacitor 72 is coupled to pad 71. Capacitor 57 is coupled to pad 74 and capacitor 54 is coupled to pad 75. Capacitors 78 and 79 in the frequency-determining circuit and crystal 44 in oscillator 45 are coupled to pads 46, 70, and 76. Power supply voltage is also coupled to pad 70. Pad 79 couples collector 52 of transistor 51 to IF amplifier 14. The series-parallel combination of inductor 35 and capacitor 36 and capacitor 34 is coupled to pad 77. Capacitor 47 is coupled between pads 46 and 77. Of particular importance is the extra width isolation diffusion barrier 80 diffused between oscillator 45 and the remainder of the integrated circuit chip, the barrier 78 prevents interaction of the oscillation with the other circuitry located on the chip. The integrated circuit chip illustrated in FIG. 2 is approximately 50 mils square.

We claim:

1. A direct current coupled frequency conversion circuit for a radio receiver having a first stage for translating a signal of a first frequency, and an intermediate frequency stage for amplifying a signal of a second lower frequency, and which receiver has a voltage supply for providing an operating voltage for the receiver which varies over a substantial range, such frequency conversion circuit converting the signal of the first frequency to a signal of the second frequency and including in combination, a semiconductor device including transistor means having base, emitter and collector electrodes, circuit means connected to said electrodes of said transistor means and to the voltage supply to form an emitter follower circuit, input means connected to said emitter follower circuit for applying the signal of said first frequency thereto, and oscillator means for producing a signal of a third frequency coupled to said emitter follower circuit, said emitter follower circuit being constructed to heterodyne said signals of said first and third frequencies to produce a signal of said second frequency.

2. The direct current coupled frequency conversion circuit of claim 1 wherein said oscillator means is a semiconductor crystal controlled oscillator of the Colpitts type.

3. The direct current coupled frequency conversion circuit of claim 1 wherein said semiconductor device further includes first transistor amplifier means having an input adapted to receive said first frequency signal and an output, said output being coupled to said emitter follower circuit, said first frequency signal being applied to one of said first amplifier input and said input means to provide a predetermined amplitude of said signal of said second frequency.

4. The direct current coupled frequency conversion circuit of claim 3 wherein said semiconductor device further includes second transistor amplifier means coupled to said emitter follower circuit for amplifying said second frequency signal.

5. The direct current coupled frequency conversion circuit of claim 3 wherein said semiconductor device further includes direct current coupled feedback circuit means coupled between said emitter follower circuit and said first amplifier means, said feedback circuit means cooperating with the voltage supply to apply stabilized bias voltages to said first amplifier means and said emitter follower circuit when the receiver voltage varies over said voltage range.

6. The direct current coupled frequency conversion circuit of claim 5 wherein said oscillator means includes a plurality of portions and wherein said first amplifier means, said emitter follower circuit, said direct current coupled feedback circuit means, and predetermined portions of said oscillator means are formed into a single integrated circuit chip.

7. The direct current coupled frequency conversion circuit of claim 6 wherein said single integrated circuit chip further includes an extra width isolation diffusion barrier for isolating said predetermined portions of said oscillator means from said first amplifier means, said emitter follower circuit, and said direct current coupled feedback circuit means.

8. The direct current coupled frequency conversion circuit of claim 3 wherein said first amplifier means includes first and second transistor means of the same conductivity type, said transistor means each having base, emitter and collector electrodes, means coupled to said electrodes of said first transistor means forming a common emitter circuit, means coupled to said electrodes of said second transistor means forming a common base circuit, said first and second transistor means being coupled together to form a cascode amplifier circuit, the base electrode of said first transistor means being adapted to receive said first frequency signal, the collector electrode of said second transistor means adapted to couple said amplified first frequency signal to said emitter follower circuit.

9. The direct current coupled frequency conversion circuit of claim 3 wherein said first amplifier means includes first and second transistor means, of the same conductivity type, each having base, emitter and collector electrodes, the base electrode of said first transistor means being adapted to receive said first frequency signal, the emitter electrode of said first transistor means being coupled to a first potential, the collector electrode of said first transistor means being coupled to the emitter electrode of said second transistor means, first reactance means coupling the base electrode of said second transistor means to said first potential, said collector electrode of said second transistor means adapted to couple the amplified first frequency signal to said emitter follower circuit.

10. A direct current coupled frequency conversion circuit for a radio receiver having a first stage for translating a signal of a first frequency, and an intermediate frequency stage for amplifying a signal of a second lower frequency, and which receiver has a voltage supply with first and second terminals for providing an operating voltage therebetween which varies over a substantial range, such frequency conversion circuit converting the signal of the first frequency to a signal of the second frequency and including in combination, first amplifier means having an input and an output, semiconductor means forming an emitter follower circuit having an input coupled to said output of said first amplifier means, oscillator means producing a signal of a third frequency coupled to said input of said emitter follower circuit, means applying a signal of the first frequency to one of said input of said first amplifier means and said input of said emitter follower circuit, said emitter follower circuit heterodyning said signals of first and third frequencies to produce a signal of said second frequency, direct current coupled feedback means coupled between said emitter follower circuit and said first amplifier means, bias circuit means coupled to the voltage supply and to said feedback means for applying a stabilized bias voltage to said first amplifier means and said emitter follower circuit in the presence of variations in the operating voltage over said voltage range, and second amplifier means coupled to said emitter follower circuit for amplifying said second frequency signal.

11. The direct current coupled frequency conversion circuit of claim 10 wherein said direct current coupled feedback means includes, first transistor means direct current coupled to said emitter follower circuit and adapted to receive therefrom a signal varying with a change in the operating voltage, said first transistor means developing a first bias voltage and being adapted to produce a change in said first bias voltage in response to said signal, second transistor means coupled between the first transistor means and the first amplifier means for coupling said first bias voltage to said first amplifier means to change the operation thereof, said first amplifier means being direct current coupled to said emitter follower circuit whereby operation of said emitter follower circuit varies in accordance with the variation in said first bias voltage to reduce said signal.

12. The direct current coupled frequency conversion circuit of claim 10 wherein said semiconductor means includes transistor means having base, emitter and collector electrodes, the collector electrode being coupled to the voltage supply, the base electrode being adapted to receive said first and third frequency signals, said first and third frequency signals being heterodyned in said semiconductor means to produce said second frequency signal, the emitter electrode of said transistor means being adapted to couple said second frequency signal to the second amplifier means.

13. The direct current coupled frequency conversion circuit of claim 12 wherein said emitter follower circuit further includes reactance means coupled to the emitter electrode of said semiconductor means, said reactance means substantially reducing the amplitude of said first and third frequency signals in relation to said second frequency signal at said emitter electrode, said reactance means further acting to prevent oscillation in said second amplifier means.

14. The direct current coupled frequency conversion circuit of claim 12 wherein said emitter follower circuit further includes first capacitive reactance means and inductive reactance means in series combination coupled to the base electrode of said semiconductor means in said emitter follower circuit, said series combination acting to form a series resonant circuit at said second frequency for improving the efficiency of said emitter follower circuit, and second capacitance means in parallel with the series combination of said inductance means and first capacitance means, said parallel combination acting to form an antiresonant circuit at said first frequency, for decreasing said emitter follower circuit sensitivity to undesired signals.

15. A direct current coupled frequency conversion circuit for converting a first frequency signal to a second frequency signal, and constructed as a single integrated circuit chip, including in combination, first input means adapted to receive a third frequency signal from an oscillator, first amplifier means having an input and output with substantial isolation therebetween means applying said first frequency signal to one of said first amplifier input and said first input means, mixer means including transistor means having base, emitter and collector electrodes, and means connected to said electrodes to form an emitter follower circuit, said mixer means having an input and a low impedance output, said mixer means input being coupled to said first input means and said first amplifier output and being operative to heterodyne in said emitter follower circuit said first and third frequency signals coupled thereto to produce said second frequency signal, and second amplifier means coupled to said mixer means output for amplifying said second frequency signal, said mixer means output acting to attenuate said first and third frequency signals and to prevent said second amplifier means from oscillating.

16. The direct current coupled frequency conversion circuit of claim 15 wherein said mixer means includes a capacitive reactance connected to said mixer means output for attenuating said first and third frequency signals.

17. The direct current coupled frequency conversion circuit of claim 15 wherein said mixer input includes first capacitive reactance means and inductive reactance means in series combination, said series combination acting to form a series resonant circuit at said second frequency for improving the efficiency of said mixer means, second capacitance means in parallel with said series combination of said inductance means and first capacitance means, said parallel combination acting to form an antiresonant circuit at said first frequency for preventing said first frequency signal from being coupled to said mixer output.

18. The direct current coupled frequency conversion circuit of claim 15 further including an oscillator having a plurality of portions with predetermined ones of said portions of said oscillator on said integrated circuit chip, said oscillator being coupled to one of said input means and said first amplifier means input, whereby said first amplifier means, said mixer means, said second amplifier means, and said predetermined portions of said oscillator are constructed in a single integrated circuit chip.

* * * * *